US011820649B2

(12) United States Patent
Panas et al.

(10) Patent No.: US 11,820,649 B2
(45) Date of Patent: Nov. 21, 2023

(54) POSITION SENSING CIRCUIT FOR AN ELECTROSTATICALLY DRIVEN MEMS DEVICE

(71) Applicant: Lawrence Livermore National Security, LLC, Livermore, CA (US)

(72) Inventors: Robert Matthew Panas, Dublin, CA (US); Princess Corral, Hayward, CA (US); Steven L. Hunter, Livermore, CA (US); Phillip Harris Paul, San Francisco, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 325 days.

(21) Appl. No.: 17/187,206

(22) Filed: Feb. 26, 2021

(65) Prior Publication Data

US 2021/0206626 A1 Jul. 8, 2021

Related U.S. Application Data

(63) Continuation-in-part of application No. 15/983,909, filed on May 18, 2018, now abandoned.

(51) Int. Cl.
*B81B 3/00* (2006.01)
*G01D 5/24* (2006.01)
*B81B 7/00* (2006.01)

(52) U.S. Cl.
CPC .......... *B81B 3/0086* (2013.01); *B81B 7/008* (2013.01); *G01D 5/24* (2013.01); *B81B 2207/03* (2013.01)

(58) Field of Classification Search
CPC .......... H03H 9/02259; H03H 9/02244; H03H 9/2405; H03H 9/505; G01C 19/5712; G01C 19/5776
See application file for complete search history.

(56) References Cited

U.S. PATENT DOCUMENTS 6,508,122 B1 1/2003 McCall et al.
8,096,179 B2 1/2012 Bien et al.
(Continued)

FOREIGN PATENT DOCUMENTS

EP 1538546 A2 6/2005

OTHER PUBLICATIONS

Hung, Andrew C.-L. et al. "An electrostatically driven 2D microscanning mirror with capacitive sensing for projection display", Sensors and Actuators A 222 (2015), pp. 122-129.
(Continued)

*Primary Examiner* — Jermele M Hollington
*Assistant Examiner* — Temilade S Rhodes-Vivour
(74) *Attorney, Agent, or Firm* — HARNESS, DICKEY & PIERCE, P.L.C.

(57) ABSTRACT

The present disclosure relates to a system for detecting movement of a microelectromechanical system (MEMS) device. The system uses a drive voltage signal source for generating a low frequency drive voltage signal for driving the MEMS device. An excitation signal source may be used for generating an excitation signal which is also applied to the MEMS device. The excitation signal has a frequency which is above a physical response capability of the MEMS device, such that operation of the MEMS device is not significantly affected by the excitation signal. A sensing impedance is used to help generate a signal which is responsive to the capacitance of the MEMS device. The capacitance of the MEMS device changes in response to movement of the MEMS device. An output subsystem is provided which responds to changes sensed by the sensing impedance, and which produces an output voltage signal. A filter filters the output voltage signal to produce a filtered output voltage signal. The filtered output voltage signal is indicative of a position of the MEMS device.

21 Claims, 3 Drawing Sheets

(56) References Cited

U.S. PATENT DOCUMENTS

| | | | |
|---|---|---|---|
| 8,188,755 | B2 | 5/2012 | Alini et al. |
| 8,952,891 | B2 | 2/2015 | Tanbakuchi et al. |
| 9,069,006 | B2 | 6/2015 | Opris et al. |
| 9,201,241 | B2 | 12/2015 | Jayapala et al. |
| 9,383,282 | B2 | 7/2016 | Besling et al. |
| 9,477,139 | B2 | 10/2016 | McKinley |
| 9,596,995 | B2 * | 3/2017 | Fuji .................. G06F 3/041 |
| 9,641,103 | B2 | 5/2017 | Gutierrez et al. |
| 2003/0179527 | A1 * | 9/2003 | Chea, Jr. ............... H02H 9/04 361/91.1 |
| 2004/0005114 | A1 | 1/2004 | Sakai et al. |
| 2006/0012361 | A1 | 1/2006 | Schubert |
| 2010/0039106 | A1 | 2/2010 | Edelstein |
| 2010/0105168 | A1 * | 4/2010 | Ramiah ............... B81C 1/0023 361/728 |
| 2010/0242603 | A1 | 9/2010 | Miller et al. |
| 2011/0062956 | A1 | 3/2011 | Edelstein |
| 2012/0194282 | A1 * | 8/2012 | Hwang ............... H03H 3/0072 331/154 |
| 2014/0230547 | A1 * | 8/2014 | El-Gamal ........ G01C 19/5698 73/504.12 |
| 2014/0355381 | A1 | 12/2014 | Lal et al. |
| 2015/0027198 | A1 | 1/2015 | Sessego et al. |
| 2015/0175407 | A1 | 6/2015 | Cheng et al. |
| 2016/0072408 | A1 | 3/2016 | Khieu et al. |
| 2017/0248443 | A1 | 8/2017 | Hrubes |

OTHER PUBLICATIONS

Specifications of AC-63/AC-62/AC-61 Force Balance Accelerometer, https://www.geosig.com/Accelerometers-ct1746.aspx [Retrieved Oct. 16, 2018], 4 pp.
Specifications of AC-63/AC-62/AC-61 Force Balance Accelerometer, https://www.geosig.com/Accelerometers-ct1746.aspx [Retrieved Oct. 16, 2018], 2 pp.
International Search Report and Written Opinion for Regarding Application No. PCT/US2019/016492, dated May 21, 2019.
International Search Report and Written Opinion regarding Application No. PCT/US2022/017964, dated Jun. 17, 2022.

* cited by examiner

POSITION SENSING CIRCUIT FOR AN ELECTROSTATICALLY DRIVEN MEMS DEVICE

CROSS-REFERENCE TO RELATED APPLICATIONS

This application is a continuation-in-part and claims priority of U.S. patent application Ser. No. 15/983,909, filed on May 18, 2018 (now allowed). The entire disclosure of the above application is incorporated herein by reference.

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to microelectromechanical sensing (MEMS) devices, and more particularly to a system and method for sensing a position of an electrostatically driven MEMS device.

BACKGROUND

This section provides background information related to the present disclosure which is not necessarily prior art.

Microelectromechanical systems (MEMS) devices are rapidly gaining popularity in a wide variety of applications spanning sensor applications, microactuators, in microelectronics applications, and with microstructures, just to name a few. MEMS devices are now being used in a wide variety of fields including the medical field, automotive applications, and precision measuring and instrumentation fields.

One challenge with MEMS devices is that the physical position of a MEMS device typically has a non-linear dependence on the drive voltage. The MEMS device may in some instances also be acted on by outside forces, which may cause it to move to a position other than its indicated or commanded position.

Other micro-mirror MEMS devices have used open loop control because, up until the present time there, there has been no reliable way to quickly and easily measure the location of the moving portion of the device in real time in closed loop fashion. The disadvantage of open loop control is that since a MEMS device is susceptible to outside forces which can influence its movement/position, the actual position of the MEMS device may differ significantly from its true position. Furthermore, if using an open loop control scheme, each MEMS device may need to be individually characterized to account for manufacturing variations that would need to be taken into account when designing the open loop control scheme/commands.

Accordingly, a system and method for accurately detecting a real time position of a MEMS device, without the aforementioned limitations and drawbacks of an open loop system, would significantly enhance the use and application of a MEMS device.

SUMMARY

This section provides a general summary of the disclosure, and is not a comprehensive disclosure of its full scope or all of its features.

In one aspect the present disclosure relates to a system for detecting movement of a microelectromechanical system (MEMS) device. The system may comprise a drive voltage signal source for generating a low frequency drive voltage signal for driving the MEMS device. An excitation signal source may be used for generating an excitation signal and applying the excitation signal to the MEMS device. The excitation signal has a frequency selected to be above a physical response capability of the MEMS device so that operation of the MEMS device is not significantly affected by the excitation signal. A sensing impedance is included which produces a signal responsive to the capacitance of the MEMS device, with the capacitance of the MEMS device changing in response to physical movement of the MEMS device. An output subsystem is included which is responsive to the signal generated by the sensing impedance, and which produces an output voltage signal. A filter is included for filtering the output voltage signal to produce a filtered output voltage signal which is indicative of a position of the MEMS device.

In another aspect the present disclosure relates to a system for detecting movement of a microelectromechanical system (MEMS) device. The system may comprise a drive voltage signal source for generating a drive voltage signal for driving the MEMS device. A modulation voltage signal source may be included for generating a modulation signal. The modulation signal has a frequency selected to be above a physical response capability of the MEMS device so that operation of the MEMS device is not significantly affected by the modulation signal. A capacitor voltage divider network may be included which is formed by a first capacitor coupled in series with the modulation voltage signal source, and a capacitance of the MEMS device representing a second capacitor. The capacitance of the MEMS device changes in response to physical movement of the MEMS device. An output component may be included which is coupled in parallel with the second capacitor, and which produces an output voltage signal. A filter may be included for removing the drive voltage signal from the output voltage signal. The output voltage signal read across the output component is indicative of a position of the MEMS device.

In still another aspect the present disclosure relates to a method for detecting movement of a microelectromechanical system (MEMS) device. The method may comprise generating a drive voltage signal for driving the MEMS device. The method may further comprise generating an excitation signal and applying the excitation signal to the MEMS device. The excitation signal has a frequency selected to be above a physical response capability of the MEMS device so that operation of the MEMS device is not significantly affected by the excitation signal. The method may involve using an impedance to sense changes in a capacitance of the MEMS device, the capacitance of the MEMS device changing in response to physical movement of the MEMS device. The method further may involve generating an output voltage signal in relation to the sensed changes in the capacitance of the MEMS device the MEMS, and filtering the output voltage signal to produce a filtered output voltage signal. The filtered output voltage signal is indicative of a position of the MEMS device.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure. Corresponding reference numerals indicate corresponding parts throughout the Figures, in which.

DETAILED DESCRIPTION

Example embodiments will now be described more fully with reference to the accompanying drawings.

Figure 1:
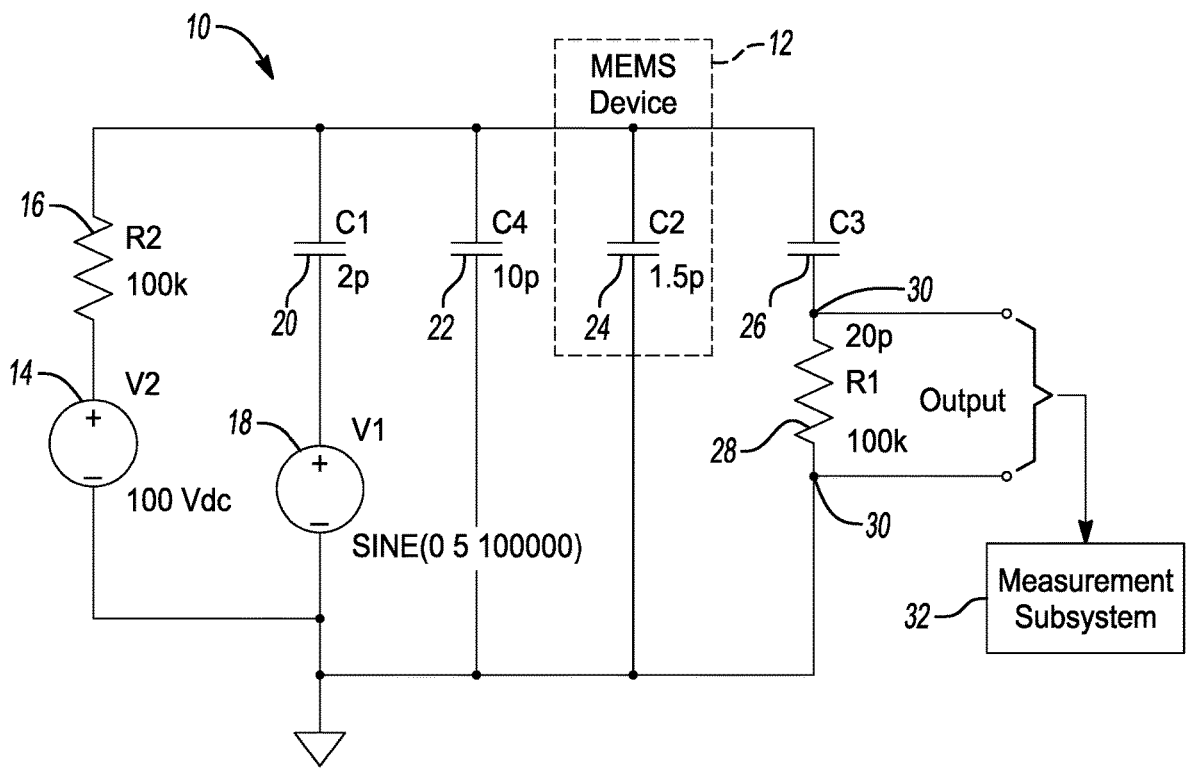
FIG. 1 is a schematic diagram of one embodiment of a system which makes use of a sensing impedance in the form of a capacitor to help determine a real time position of a MEMS device.

Referring to FIG. 1, one embodiment of a system 10 is shown for detecting a real time position, angle, orientation, etc., of a MEMS device 12, in accordance with the present disclosure. In this example the MEMS device 12 is a movable device which is movable between at least first and second positions, or between a larger plurality of positions, angles or orientations, in other words over a range of positions, angles or orientations.

The system 10 includes a DC voltage source 14 (V2) which represents the MEMS device 12 drive signal (i.e., DC drive voltage), which in this example is 100 Vdc. As will be appreciated, this is just one example of a suitable drive voltage and the precise drive voltage used will depend in large part of the construction and type of the actual MEMS device 12 being monitored. Resistor 16 (R2) is a current limiting resistor and allows a modulation signal source 18 (V1), which in this example is a 5 Vdc signal @ 100 KHz, to add to the drive voltage source 14 (V2). This modulation signal may also vary depending on the specific MEMS device being monitored. Resistor 16 (R2) in this example has a value of 100K ohms, but again this value may vary to meet the needs of a specific system design.

Capacitor 20 (C1) is the capacitor that couples the modulation signal from modulation signal source 18 (V1) to the MEMS drive signal. Capacitor 22 (C4) represents parasitic capacitance in the circuit formed by the system 10, which in this example is about 10p. Capacitor 24 (C2) represents the MEMS device 12 capacitance, which will change in accordance with movement of the MEMS device. Capacitor 26 (C3) is the output coupling capacitor, and the output signal of the system 10 is sampled at the junction of capacitor 26 (C3) and resistor 28 (R1) (i.e., across output points 30). Optionally, the output signal may be transmitted to a measurement subsystem 32 or other form of measurement component (or possibly even to an electronic controller with measurement reading capability) configured to interpret the output signal and to determine the position of the MEMS device 12.

The capacitances of capacitors 20 (C1) and 24 (C2) may vary depending on system requirements and the characteristics of the specific MEMS device 12 being used, but in one example the capacitor 20 (C1) may have a capacitance of 2p and the capacitance of the MEMS device, represented by capacitor 24 (C2) in FIG. 1, may be about 1.5p.

The system 10 thus adds a modulation signal from the modulation signal source 18 (V1) to the drive signal voltage generated by the DC voltage drive signal source 14 (V2). The modulation signal frequency (e.g., in this example 100 KHz) is much higher than the physical response capability of the MEMS device 12, so it does not affect the operation of the MEMS device 12. In this example the modulation frequency is 100 KHz, but again this precise frequency may be selected to meet the needs of a specific application and/or a specific MEMS device.

The capacitor 20 (C1) that couples the modulation signal onto the MEMS drive signal (from signal source 14) is similar to the capacitance of the MEMS device 12, which as noted above is represented by the capacitor 24 (C2), so the two capacitors 20/24 form a capacitor voltage divider network. By "similar" it is meant that Capacitor 20 (C1) preferably is less than about 10 times the value of capacitor 24 (C2), although in practice they only need to be similar so that there is a good signal-to-noise ratio between them.

As the MEMS device 12 moves (i.e., changing its position, angle, orientation, etc.), its capacitance changes, and the peak-to-peak voltage of the modulation signal from modulation signal source 18 (V1) also changes as a result. The change in peak-to-peak voltage of the modulation signal source 18 (V1) is due to the change in the ratio of the two capacitors 20 and 24 (C1 and C4).

The signal at the MEMS device 12 is high pass filtered by filtering capacitor 26 (C3) used in combination with an output resistor 28 (R1) to remove the drive signal, if the MEMS device is an active device. Capacitors 20 (C1), 24 (C2) and 26 (C3) are thus coupled in parallel. The change in the modulation signal, which results across the output resistor 28 (i.e., across output points 30), is used to detect the change in the MEMS device 12 position, angle, orientation, etc. The amplitude of the output signal across points 30 can be used by the measurement subsystem 32 to determine the position, angle or orientation (i.e., more broadly movement) of the MEMS device 12, or synchronous rectification may be used to obtain the magnitude and phase of the signal. Synchronous detection provides for much higher noise rejection than filtering alone could provide.

The system 10 thus forms a means for reliably detecting movement and/or a position, angle, orientation, etc. of a MEMS device in real time, and even more importantly, over a range of possible positions, angles or orientations that the MEMS device is capable of. The system 10 can be implemented with relatively low cost and does not affect or influence operation of the MEMS device which it is monitoring.

The system 10 may also be retrofitted to existing circuits or systems being used with a MEMS device, and again, will not influence or otherwise tangibly affect operation of the MEMS device.

Figure 2:
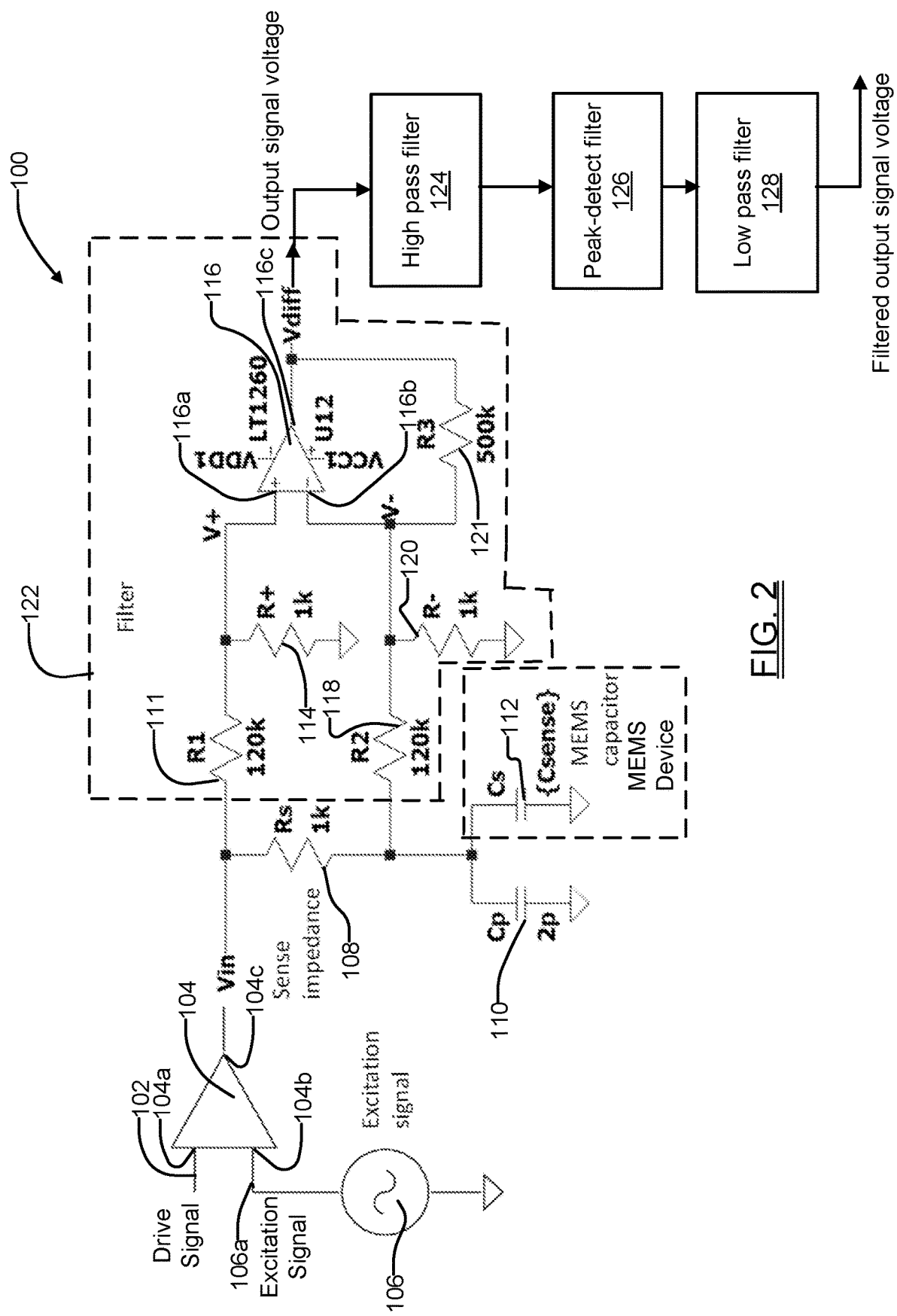
FIG. 2 is a schematic diagram of another embodiment of the present disclosure which makes use of a resistor as the sensing impedance which senses movement of the MEMS device.

Referring to FIG. 2, a position/movement sensing system 100 in accordance with another embodiment of the present disclosure is shown. Components in common with those used in the system 10 will be denoted with reference numbers increased by 100 over those used for the common components shown in FIG. 1.

The system 100 in this example uses a drive modulator (AC signal source) to produce a drive signal 102 which feeds one input 104a of a drive amplifier 104 with a low frequency, high voltage drive signal. The other input 104b receives a very high frequency, low voltage scale modulation or "excitation" signal 106a (hereinafter simply "excitation signal") from an AC excitation signal source 106. The drive amplifier 104 combines and amplifies the received signals up to a high level to produce a signal at its output 104c that is used as the Vin signal needed for driving the system 100. The frequency of the drive signal 102 is in this embodiment relatively low, while the frequency of the excitation signal 106a is much higher. In some embodiments the frequency of the drive signal 102 may be about 40 kHz, while the frequency of the excitation signal 106a may be much higher, for example about 4 MHz in some embodiments.

A high-side sense impedance, in this example a sense resistor 108, is coupled in series with a pair of parallel coupled capacitors 110 and 112. Capacitor 110 (Cp) represents the parasitic capacitance of the system 100, and capacitor 112 (Csense) represents the MEMS device 12 capacitance. The MEMS device 12 capacitance represented by capacitor 112 (Csense) will vary with the position, angle, tilt, etc. of the MEMS device. Resistor 111 (R1) and resistor 114 (R+) form a first resistor divider network to scale the voltage placed on a non-inverting input 116a of a differential amplifier 116 to a suitable value for the differential amplifier. Similarly, resistor 118 (R2) and resistor 120 (R−) form a second resistor divider network to scale a voltage placed on the inverting input 116b of the differential amplifier 116 to a suitable value. The output of the differential amplifier 116 is the difference between the signals being provided on its inputs 116a and 116b, after being amplified by the differential amplifier. Resistor 121 (R3) helps to scale the feedback signal being applied to the inverting input 116b of the amplifier 116. Collectively, the resistors 111, 114, 118, 120, as well as differential amplifier 116, may be viewed as an output subsystem 122.

During operation of the system 100, both of the signals 102 and 106a combine to drive the voltage across the capacitor 112, and thus the current flow onto/off the capacitor 112. Virtually no current flows through resistor 111 (R1); virtually all of the current from the output 104c of the drive amplifier 104 flows down through the sense resistor 108. The sense resistor 108 (Rs) will produce a signal which tracks the value of the sense capacitor 112 (Cs). By "tracks" it is meant that the modulation in the current across the sense resistor 108 will scale with the capacitance of the sense capacitor 112. With the system 100, which forms a resistive sensor approach, the sense resistor 108 will turn the current flows onto/off the sense capacitor 112 into a voltage signal from which the MEMS capacitance value can be extracted. The differential amplifier 116 forms an amplifying filter which extracts the signal of interest, which is the voltage across the sense resistor 108. The differential amplifier 116 will then generate a signal at its output 116c that combines both the current flow due to the driving voltage signal 102 (i.e., low frequency and high voltage swings) and the excitation voltage signal 106a (high frequency and low voltage swings).

The response to the excitation voltage signal 106a is the key sense signal in the case of the resistive sensor approach used by the system 100. This is because the current flow onto/off the sense capacitor 112 (i.e., representing the capacitance of the MEMS device) is a direct function of its capacitance, given that the excitation voltage signal 106a is a constant amplitude and frequency. Thus, the MEMS capacitance represented by the sense capacitor 112 can be directly determined from the current flow driven by the excitation voltage signal 106a.

A series of conventional filters can be used to help isolate the response to the excitation voltage signal 106a, since the excitation voltage signal occurs in a much higher frequency range. For example, FIG. 2 shows a series of filters in highly simplified form that can be used to isolate the response to the excitation voltage signal 106a. This series of filters may be a high pass filter 124 to isolate the excitation voltage, then a peak-detect filter 126 to extract the amplitude of the high frequency modulation. Finally a low pass filter 128 may be used to smooth out the changing amplitude, since the amplitude changes are only at the frequency scale of the MEMS response, and are therefore at a significantly lower frequency than that of the excitation voltage signal 106a. The output from the low pass filter 128 provides a measure of the MEMS capacitance, which is the real time value of the sense capacitor 112.

Figure 3:
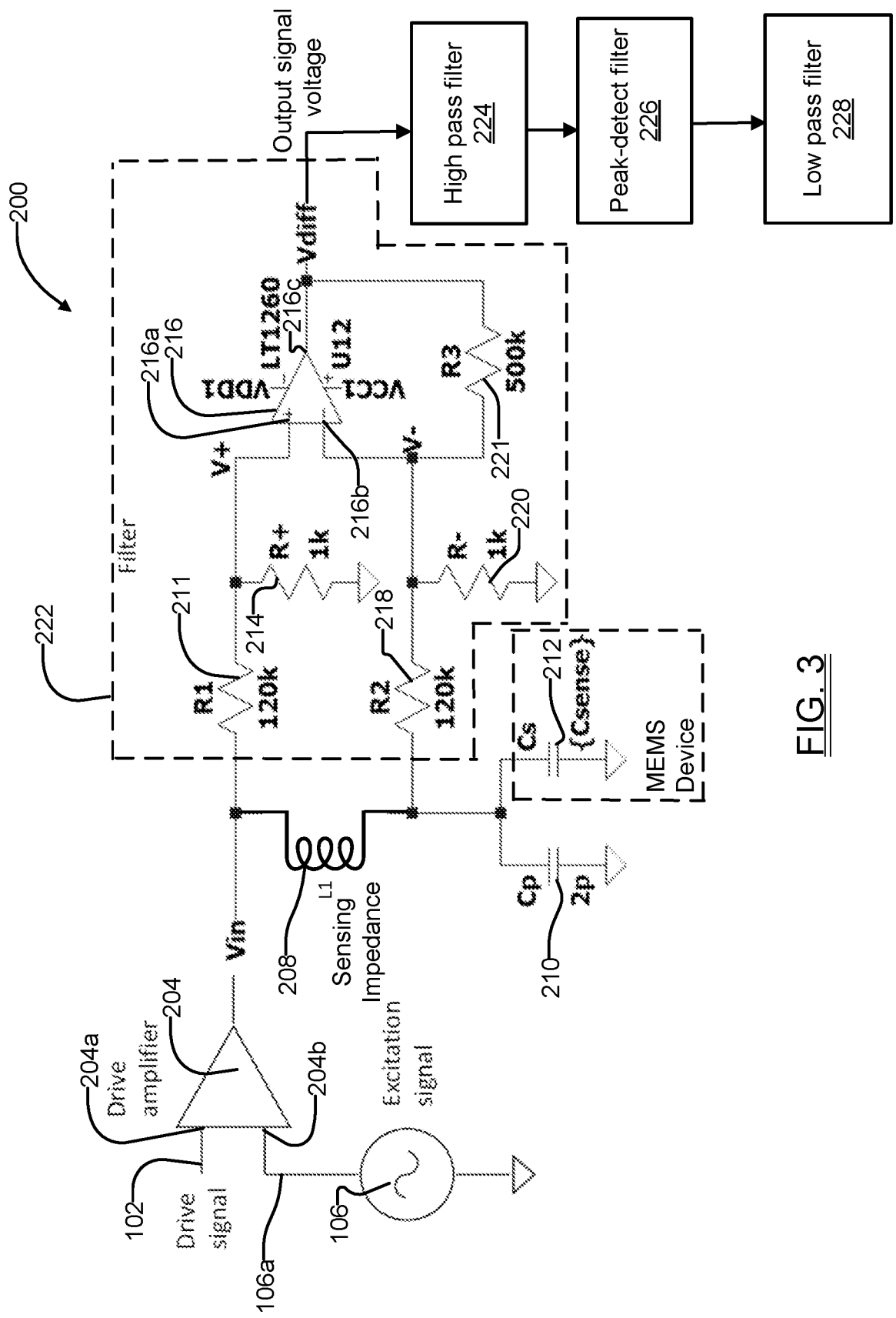
FIG. 3 is a schematic diagram of another embodiment of the present disclosure which makes use of an inductor as the impedance sensing component.

FIG. 3 shows a system 200 in accordance with still another embodiment of the present disclosure. The system 200 in this embodiment is substantially similar to the system 100 in construction, and differs principally in the use of an inductor 208. For this reason, components in common with the system 100 discussed in connection with FIG. 2 have been labelled in FIG. 3 with reference numbers increased by 100 over those used for the same components in FIG. 2.

The system 200 of FIG. 3 operates similarly to that of the system 100 in that it combines two signals into the circuit, the first being the low frequency, high voltage drive signal 102, which is applied to one input 204a of a drive amplifier 204. The second signal is the very high frequency, low voltage scale excitation signal 106a, which is applied to the other input 204b of the drive amplifier 204. Both signals combine to drive the voltage across a sensing capacitor 212 (i.e., part of the MEMS device, hereinafter the "MEMS capacitor"), and thus the current flow onto/off the MEMS capacitor 212. The inductor 208 forms the sense impedance element and produces a signal (generally a voltage) which tracks the value of the MEMS capacitor 212. The inductor has a higher impedance at higher frequencies. This means the sense inductor 208 will show a higher response to high frequency signals than low frequency signals, helping amplify the excitation signal 106a. Optionally, a pair of inductors connected in a transformer could be used instead of the single sense inductor 208 shown in FIG. 3. One of the inductors in the pair would be in series with the MEMS capacitor 212. The other inductor in the pair would span across the rest of the sensing circuitry. The transformer effect would ensure the two inductors share the same AC voltage, but this could be done without passing the DC voltage to the rest of the sensing circuitry. While either the single inductor or inductor transformer would be valuable from a sensing perspective to reduce the high voltage scale applied to the MEMS capacitor 212, and thus make it easier to carry out precision sensing at lower voltages after the transformer, they both require a larger footprint than capacitive or resistive approaches. Furthermore, both are sensitive to manufacturing variation in the inductors, meaning that arrays of sensors might have significantly different sensitivity and may also AC couple to one another during operation, in such instance likely creating cross-talk.

During operation of the system 200, the sense inductor 208 turns the current flows onto/off the MEMS capacitor 212 into a voltage. An amplifying filter 222 is attached to the sense impedance 208 to extract the signal of interest. In the case of the inductive sensor approach shown in FIG. 3, this is a differential amplifier 216 using a resistive divider network (resistors 211/214 and 218/220) to scale the voltage reading to the right scale for application to inputs 216a and 216b of the amplifier 216. The amplifier 216 outputs a signal at its output 216c that combines both the current flow due to the driving voltage (low frequency and high voltage swings) and the excitation voltage (high frequency and low voltage swings). Resistor 221 helps to scale the feedback signal being applied to the inverting input 216b of the amplifier 216. As with the system 100, the response of the system 200 to the excitation voltage is the key sense signal as the current flow onto/off the MEMS capacitor 212 is a direct function of the capacitance, given that the excitation voltage is a constant amplitude and frequency. Thus, the MEMS capacitance 212 can thus be directly determined from the current flow driven by the excitation voltage 106a. A series of filters 224, 226 and 228 can be used to isolate the response to the excitation voltage 106a, in the same manner described above for the filters 124, 126 and 128.

While specific voltages, resistances and capacitances have been mentioned in the foregoing discussion, it will be appreciated that these are merely to provide one example of parameters that are suitable in implementing the system 10, but the present disclosure is not limited to use with components have specific voltages, resistances or capacitances.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

What is claimed is:

1. A system for detecting movement of a microelectromechanical system (MEMS) device, comprising:
    a drive voltage signal source for generating a low frequency drive voltage signal;
    an excitation signal source for generating a high frequency excitation signal and applying the excitation signal to the MEMS device, the excitation signal having a frequency selected to be above a physical response capability of the MEMS device, such that operation of the MEMS device is not significantly affected by the excitation signal;
    an amplifier configured to receive both the low frequency drive voltage signal from the drive voltage signal source and the excitation signal from the excitation signal source, and to superimpose the low frequency drive voltage signal and the excitation signal to generate a Vin signal for driving the MEMS device;
    a sensing impedance which will produce a signal responsive to a capacitance of the MEMS device when driven by the Vin signal, the capacitance of the MEMS device changing in response to physical movement of the MEMS device;
    an output subsystem responsive to the signal generated by the sensing impedance, and producing an output voltage signal; and
    a filter for filtering the output voltage signal to produce a filtered output voltage signal which is indicative of a position of the MEMS device.

2. The system of claim 1, wherein the sensing impedance comprises a sensing resistor.

3. The system of claim 2, wherein the sensing resistor is in series with the MEMS device.

4. The system of claim 2, wherein the output subsystem includes a differential amplifier for amplifying a signal obtained from the sensing resistor to create the output voltage signal.

5. The system of claim 4, wherein the output subsystem further includes:
    a first resistor divider network in communication with a first voltage signal present on a first side of the sensing resistor, a first input of the differential amplifier configured to receive the first voltage signal; and
    a second resistor divider network in communication with a second voltage signal present on a second side of the sensing resistor, and a second input of the differential amplifier configured to receive the second voltage signal; and the differential amplifier configured to amplify a difference between the first and second voltage signals.

6. The system of claim 1, wherein the sensing impedance comprises a sensing capacitor.

7. The system of claim 4, wherein the sensing capacitor is in parallel with the MEMS device.

8. The system of claim 1, wherein the sensing impedance comprises a sensing inductor.

9. The system of claim 8, wherein the sensing impedance is in series with the MEMS device.

10. The system of claim 1, wherein the filter is configured to remove a signal component associated with the excitation signal, to produce the filtered output voltage signal.

11. The system of 10, wherein the filter further includes a peak-detect filter responsive to an output of the filter for detecting an amplitude peak of the filtered output voltage signal.

12. The system of claim 11, wherein the filter further includes a low pass filter responsive to an output from the peak-detect filter, for smoothing the filtered output voltage signal.

13. A system for detecting movement of a microelectromechanical system (MEMS) device, comprising:
 a drive voltage signal source for generating a drive voltage signal for driving the MEMS device;
 a modulation voltage signal source for generating a modulation signal, the modulation signal having a frequency selected to be above a physical response capability of the MEMS device, such that operation of the MEMS device is not significantly affected by the modulation signal;
 a capacitor voltage divider network formed by a first capacitor coupled in series with the modulation voltage signal source, and a capacitance of the MEMS device representing a second capacitor, the capacitance of the MEMS device changing in response to physical movement of the MEMS device;
 an output component coupled in parallel with the second capacitor, and producing an output voltage signal;
 a filter for removing the drive voltage signal from the output voltage signal;
 wherein the output voltage signal read across the output component is indicative of a position of the MEMS device; and
 wherein a change in a ratio of voltage drops across the first and second capacitors is used to help form the output voltage.

14. The system of claim 13, wherein the output component is a resistor.

15. The system of claim 13, wherein the filter is configured to isolate the modulation signal.

16. The system of claim 15, wherein the high pass filter is formed by a filtering capacitor in series with the output resistor.

17. The system of claim 16, wherein the filtering capacitor operates to block a DC high voltage associated with the drive voltage signal.

18. The system of claim 13, wherein the modulation voltage signal source has a modulation frequency of 100 KHz.

19. The system of claim 13, wherein:
 the first capacitor and the second capacitor forming the capacitor voltage divider network have capacitance values such that the first capacitor has a capacitance value which is less than about 10 times a value of capacitance of the second capacitor;
 the system further including:
  a current limiting resistor coupled in series with the voltage drive signal source; and
  at least one of an electronic controller and an electronic measurement subsystem configured to receive the output voltage signal from the output component and to interpret the output voltage signal to determine a position of the MEMS device based on the output voltage signal; and
 wherein the drive voltage signal source produces a drive voltage of about 100 Vdc, and the modulation voltage signal source produces a voltage of about 5 Vdc with a modulation frequency of about 100 KHz.

20. A method for detecting movement of a microelectromechanical system (MEMS) device, comprising:
 generating a low frequency drive voltage signal using a drive voltage signal source;
 generating a high frequency excitation signal using an excitation signal source, the excitation signal having a frequency selected to be above a physical response capability of the MEMS device, such that operation of the MEMS device is not significantly affected by the excitation signal;
 using an amplifier configured to receive both the low frequency drive voltage signal from the drive voltage signal source and the excitation signal from the excitation signal source, and to superimpose the low frequency drive voltage signal and the excitation signal to generate a Vin signal for driving the MEMS device;
 applying the Vin signal to the MEMS device to drive the MEMS device;
 using an impedance to generate a signal in relation to a capacitance of the MEMS device, a capacitance of the MEMS device changing in response to physical movement of the MEMS device as the MEMS device is driven by the Vin signal, and causing a change;
 using the signal generated by the impedance to help generate an output voltage signal in relation to sensed changes in the capacitance of the MEMS device the MEMS;
 filtering the output voltage signal to produce a filtered output voltage signal; and
 wherein the filtered output voltage signal is indicative of a position of the MEMS device.

21. The method of claim 20, wherein using an impedance to sense changes in a capacitance of the MEMS device comprises using at least one of a capacitor, a resistor, or an inductor, an impedance of which is influenced by the position of the MEMS device.

* * * * *